United States Patent
Hsiao et al.

(10) Patent No.: US 9,449,829 B1
(45) Date of Patent: Sep. 20, 2016

(54) SEMICONDUCTOR PROCESS

(71) Applicant: UNITED MICROELECTRONICS CORP., Hsin-Chu (TW)

(72) Inventors: Yu-Tung Hsiao, Tainan (TW);
Chien-Liang Lin, Taoyuan (TW);
Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/705,960

(22) Filed: May 6, 2015

(51) Int. Cl.
*H01L 21/28* (2006.01)
*H01L 29/51* (2006.01)
*H01L 29/49* (2006.01)

(52) U.S. Cl.
CPC ... *H01L 21/28185* (2013.01); *H01L 21/28088* (2013.01); *H01L 29/4966* (2013.01); *H01L 29/517* (2013.01); *H01L 29/518* (2013.01)

(58) Field of Classification Search
CPC ........... H01L 21/28185; H01L 29/517; H01L 21/28088; H01L 29/4966; H01L 29/518
USPC ......................................... 438/591
See application file for complete search history.

(56) References Cited

U.S. PATENT DOCUMENTS

| | | | |
|---|---|---|---|
| 6,858,524 B2 | 2/2005 | Haukka | |
| 7,135,361 B2 | 11/2006 | Visokay | |
| 8,809,175 B2 | 8/2014 | Tsai | |
| 2013/0017678 A1* | 1/2013 | Tsai | H01L 21/28088 438/591 |
| 2013/0203230 A1 | 8/2013 | Chen | |

* cited by examiner

*Primary Examiner* — Caleen Sullivan
(74) *Attorney, Agent, or Firm* — Winston Hsu; Scott Margo

(57) ABSTRACT

A semiconductor process includes the following steps. A dielectric layer is formed on a substrate. A barrier layer is formed on the dielectric layer. An ammonia thermal treatment process with a processing temperature of 650° C.~700° C. and a nitrogen containing gas annealing process with a processing temperature of 900° C.~1000° C. are sequentially performed on the barrier layer. The present invention also provides a semiconductor process including the following steps. A dielectric layer is formed on a substrate. A first nitrogen containing thermal treatment process is performed on the dielectric layer. A barrier layer is formed on the dielectric layer. A second nitrogen containing thermal treatment process and then an annealing process are performed in-situ on the barrier layer.

20 Claims, 5 Drawing Sheets

SEMICONDUCTOR PROCESS

BACKGROUND OF THE INVENTION

1. Field of the Invention

The present invention relates generally to a semiconductor process, and more specifically to a semiconductor process applying thermal treatments on metal gates.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

Poly-silicon is conventionally used as a gate electrode in semiconductor devices, such as transistors. With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

Moreover, with a trend towards scaling down the size of transistors, the thickness of agate dielectric layer must be reduced; if the gate dielectric layer is insufficient for sustaining a breakdown voltage, however, the phenomenon of serious leakage current will occur. Hence, processes may be necessary to improve the quality of the gate dielectric layer. How to establish processes suitable for improving the quality and the reliability of high-k dielectric layer is therefore an important issue in the field.

SUMMARY OF THE INVENTION

The present invention provides a semiconductor process, which performs thermal treatment processes on high-k layers as well as barrier layers to improve performances of transistors.

The present invention provides a semiconductor process including the following steps. A dielectric layer is formed on a substrate. A barrier layer is formed on the dielectric layer. An ammonia thermal treatment process with a processing temperature of 650° C.~700° C. and a nitrogen containing gas annealing process with a processing temperature of 900° C.~1000° C. are sequentially performed on the barrier layer.

The present invention provides a semiconductor process including the following steps. A dielectric layer is formed on a substrate. A first nitrogen containing thermal treatment process is performed on the dielectric layer. A barrier layer is formed on the dielectric layer. A second nitrogen containing thermal treatment process and then an annealing process are performed in-situ on the barrier layer.

According to the above, the present invention provides a semiconductor process, which performs a first nitrogen containing thermal treatment process on a dielectric layer to dope ultra-light nitrogen atoms into the dielectric layer; forms a barrier layer on the dielectric layer; and then, performs a second nitrogen containing thermal treatment process and then an annealing process (in-situ) on the barrier layer to dope nitrogen atoms into the barrier layer to improve performances of a formed transistor such as circuit leakage density (Jg) or time-dependent dielectric breakdown (TDDB) of the formed transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
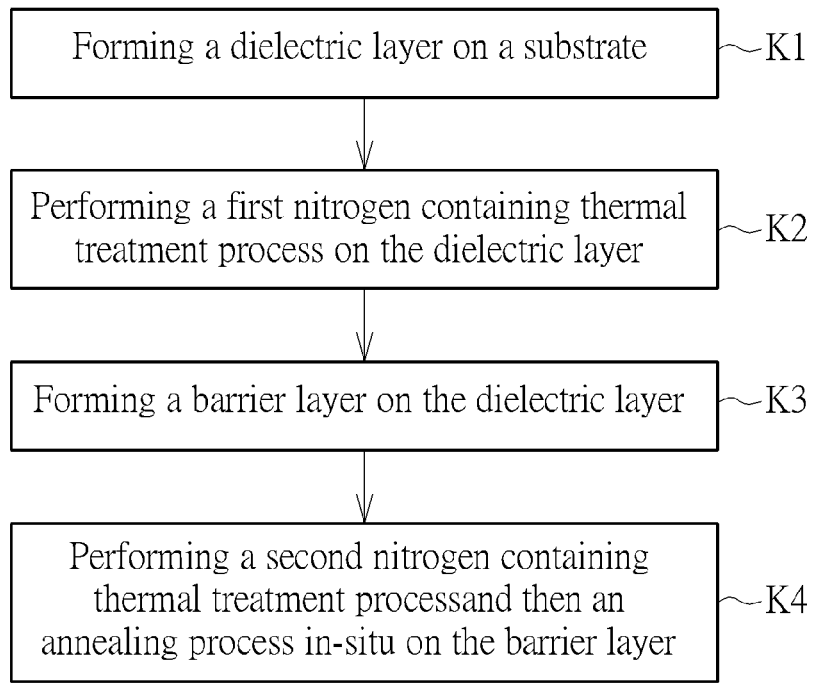
FIG. 1 schematically depicts a flow chart of a semiconductor process according to an embodiment of the present invention.

FIG. 1 schematically depicts a flow chart of a semiconductor process according to an embodiment of the present invention. FIGS. 2-10 schematically depict cross-sectional views of a semiconductor process according to an embodiment of the present invention. According to step K1 of FIG. 1—forming a dielectric layer on a substrate is performed. The substrate may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate etc. The dielectric layer may be a dielectric layer having a high dielectric constant, an oxide layer or others.

Figure 2:
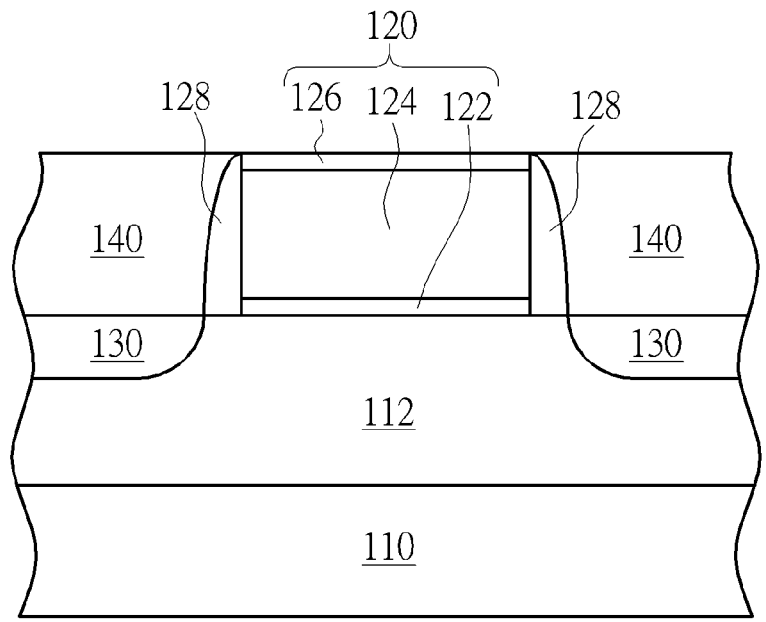
FIGS. 2-10 schematically depict cross-sectional views of a semiconductor process according to an embodiment of the present invention.

For instance, as shown in FIG. 2, a substrate 110 is provided. The substrate 110 is a silicon substrate, but it is not limited thereto. At least a fin structure 112 and an isolation layer (not shown) are formed in the substrate 110, wherein the isolation layer may be silicon oxide or others and the bottom part of the fin structure 112 is surrounded by the isolation layer to form shallow trench isolations.

In this embodiment, a tri-gate MOSFET is supposed to be formed on the fin structure 112, but the present invention is not limited thereto. Instead, the present invention may be applied to form other multi-gate MOSFETs, planar transistors or other semiconductor structures, depending upon practical requirements. Methods of forming the fin structure 112 may include, but not limited to, the following. A bulk bottom substrate (not shown) is provided. A hard mask layer (not shown) is formed on the bulk bottom substrate (not shown) and is patterned to define the location of the fin structure 112, which will be formed in the bulk bottom substrate (not shown). An etching process is performed to form the fin structure 112 in the bulk bottom substrate (not shown). Thus, the fin structure 112 located in the substrate 110 is formed completely. In this embodiment, the hard mask layer (not shown) is removed after the fin structure 112 is formed, and the tri-gate MOSFET can be formed in the following processes. There are three contact faces between the fin structure 112 and the following formed dielectric layer functioning as a carrier channel whose width is wider than a channel width in a conventional planar MOSFET. When a driving voltage is applied, the tri-gate MOSFET produces a double on-current comparing to the conventional planar MOSFET. In another embodiment, the hard mask layer (not shown) is reserved to form a fin field effect transistor (FinFET), which is another kind of multi-gate MOSFET. Due to the hard mask layer (not shown) being reserved in the fin field effect transistor, there are only two contact faces between the fin structure 112 and the following formed dielectric layer.

In this embodiment, the substrate 110 is a silicon substrate. In addition, a silicon-on-insulator substrate (not shown) may be provided, and then a single crystalline silicon layer being a top part of the silicon-on-insulator substrate (not shown) is etched till an oxide layer being a middle part of the silicon-on-insulator substrate (not shown) is exposed, meaning a fin structure formed on the silicon-on-insulator substrate (not shown) is finished.

The semiconductor process of the present invention is applied in a gate-last for high-k last process in this embodiment. However, the present invention is not restricted thereto. In other embodiments, the semiconductor process of the present invention may be applied in a gate-last for high-k first process, a gate-first process or other processes, depending upon practical requirements. Thus, a dielectric layer 122, a sacrificial electrode layer 124 and a cap layer 126 are sequentially formed from bottom to top and disposed across the fin structure 112 and the substrate 110, thereby a dummy gate 120 being formed, which will be replaced by a metal gate through a replacement metal gate (RMG) process. The method of forming the dielectric layer 122, the sacrificial electrode layer 124 and the cap layer 126 may include: a dielectric layer (not shown), a sacrificial electrode layer (not shown) and a cap layer (not shown) being blanketly formed and patterned. Due to a gate-last for high-k last process being applied in this embodiment, the dielectric layer 122 will be removed in later processes and then a gate dielectric layer having a high dielectric constant is formed. Therefore, the material of the dielectric layer 122 may be just a sacrificial material suitable for being removed in later processes, which may be an oxide layer, formed by a thermal oxide process or a chemical oxide process, but it is not limited thereto. The sacrificial electrode layer 124 may be a polysilicon layer; the cap layer 126 may be a single layer or a dual layer composed of a nitride layer or an oxide layer etc., for serving as a patterned hard mask, but it is not limited thereto. A spacer 128 may be formed on the substrate 110 and the fin structure 112 beside the dummy gate 120. The spacer 128 may be a single layer structure or a dual layer structure composed of silicon nitride or silicon oxide etc.

A source/drain 130 is formed in the fin structure 112 beside the spacer 128 by processes such as a suitable ion implantation process. Moreover, before/after the spacer 128 and the source/drain 130 are formed, an offset (not shown) may be formed on the substrate 110 and the fin structure 112 beside the dummy gate 120; and then, a lightly doped source/drain (not shown) may be formed in the fin structure 112 beside the offset by performing processes such as a suitable lightly doped ion implantation process. An epitaxy process may be performed before/after/while the spacer 128 and the source/drain 130 is formed to form an epitaxial structure (not shown) in the fin structure 112 beside the spacer 128. Therefore, the lightly doped source/drain, the source/drain 130 and the epitaxial structure may be partially or entirely overlapped.

A dielectric layer 140 may blanketly cover the substrate 110 and the fin structure 112 beside the spacer 128. More precisely, a dielectric material (not shown) may entirely cover the dummy gate 120, the substrate 110 and the fin structure 112, and then be planarized to form the dielectric layer 140 on the substrate 110 and the fin structure 112 beside the spacer 128, as shown in FIG. 2.

The dielectric layer 140 may be an inter-level dielectric layer, but it is not limited thereto.

Figure 3:
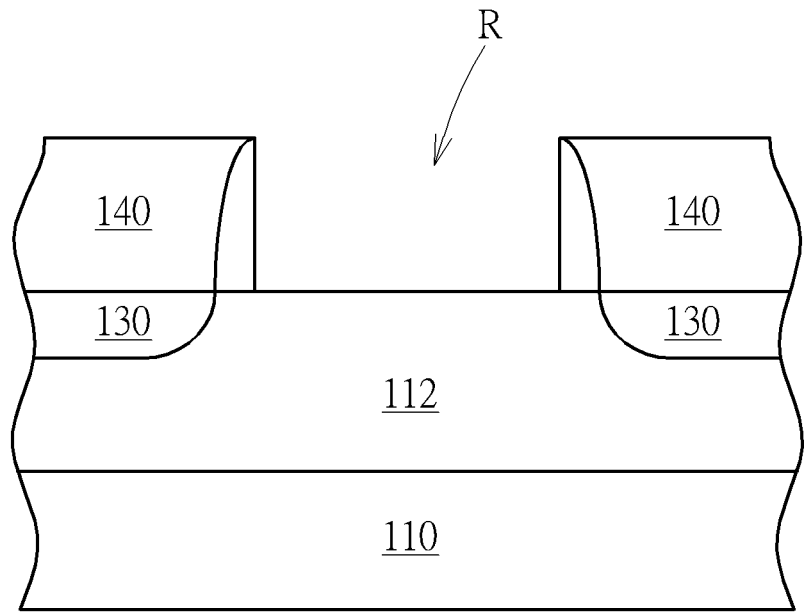

Thereafter, the dummy gate 120 is removed, and thus a recess R is formed to expose the fin structure 112, as shown in FIG. 3. Hence, a metal gate can be formed in the recess R in later processes. In one case, a pre-cleaning process (not shown) may then be optionally performed on the fin structure 112 to clean the fin structure 112 before layers formed thereon. The pre-cleaning process (not shown) may be a cleaning process containing a dilute hydrofluoric acid (DHF), but it is not limited thereto.

Figure 4:
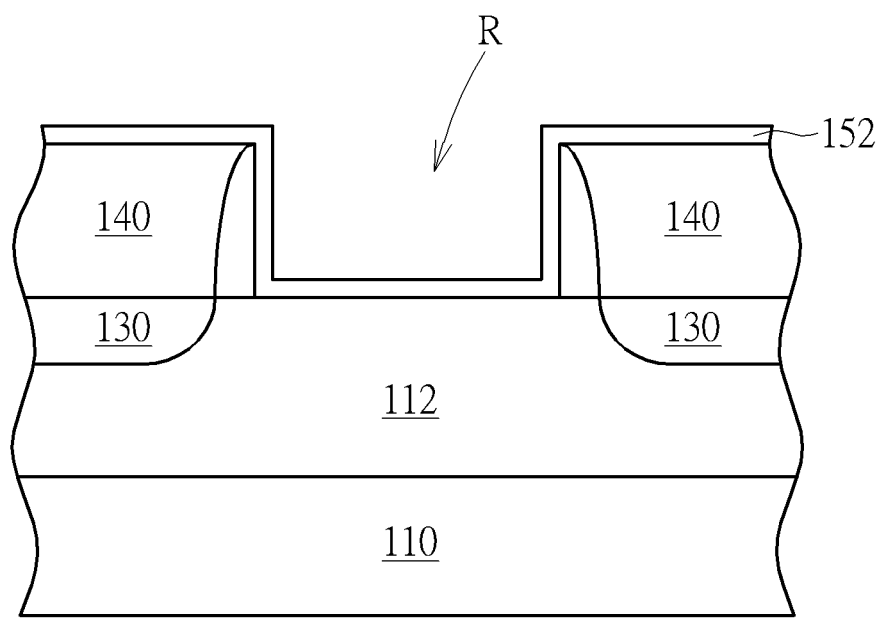
Figure 5:
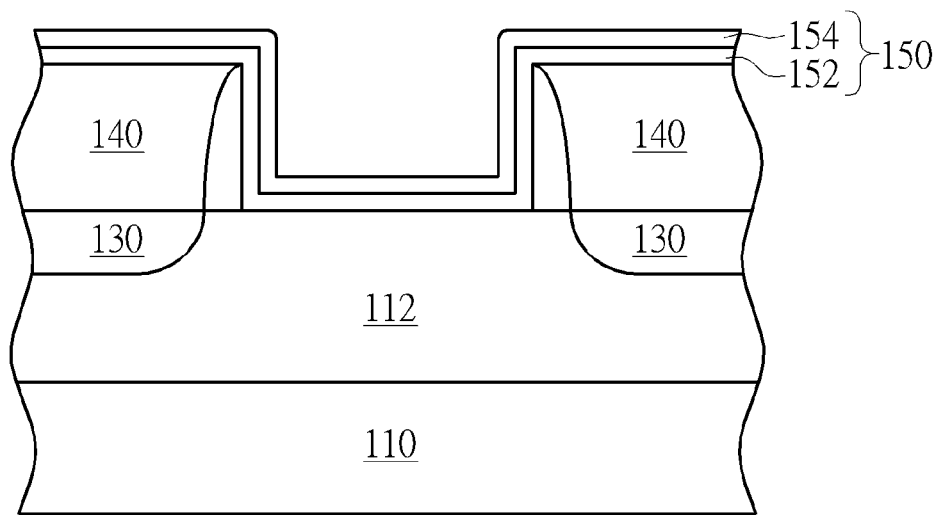

As shown in FIGS. 4-5, a dielectric layer 150 may be formed on the fin structure 112. The dielectric layer 150 may be a buffer layer 152 and a dielectric layer having a high dielectric constant 154 from bottom to top. More precisely, as shown in FIG. 4, the buffer layer 152 may optionally cover the recess R and the dielectric layer 140. Then, as shown in FIG. 5, the dielectric layer having a high dielectric constant 154 may cover the buffer layer 152. The buffer layer 152 may be an oxide layer, which is formed through a chemical oxide process in this embodiment, but may be formed through a thermal oxide process instead in other embodiments, but it is not limited thereto. The buffer layer 152 is located between the dielectric layer having a high dielectric constant 154 and the substrate 110 to buffer the dielectric layer having a high dielectric constant 154 and the substrate 110. The dielectric layer having a high dielectric constant 154 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but it is not limited thereto. In one case, the buffer layer 152 may have a thickness of 5~10 angstroms while the dielectric layer having a high dielectric constant 154 may have a thickness of 15~20 angstroms, but it is not limited thereto. In this embodiment, the dielectric layer having a high dielectric constant 154 is a single layer, but the dielectric layer having a high dielectric constant 154 may be a multi-layer in other embodiments.

Figure 6:
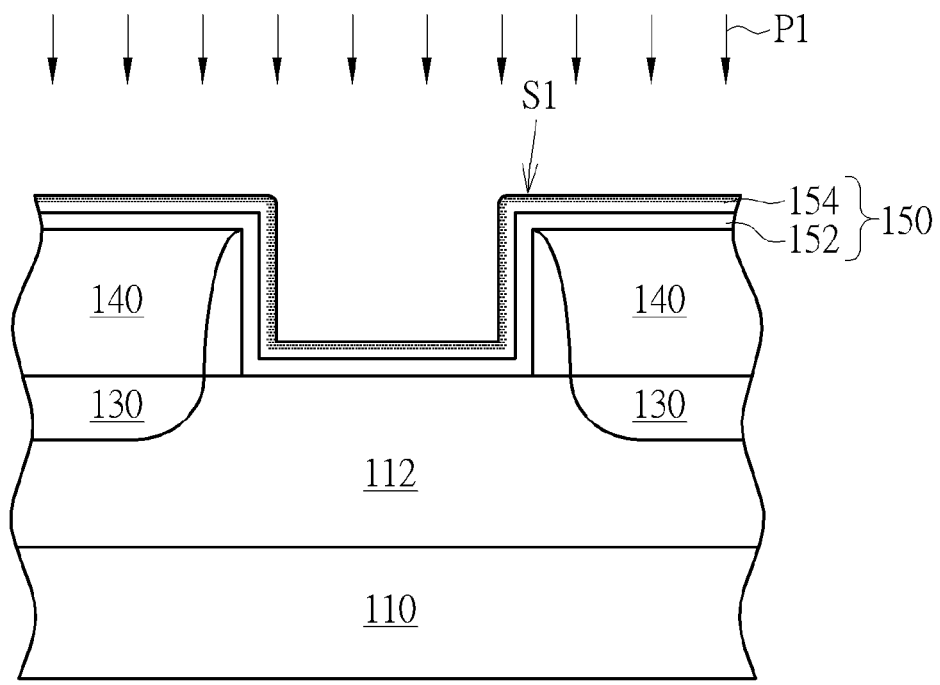

According to the step K2 of FIG. 1—performing a first nitrogen containing thermal treatment process on the dielectric layer is performed. As shown in FIG. 6, a first nitrogen containing thermal treatment process P1 is performed on the dielectric layer 150. Thereby, ultra-light nitrogen atoms can be doped into the dielectric layer 150 to prevent oxygen atoms diffusing from above layers such as a later formed barrier layer into the dielectric layer 150, that would lead to the equivalent oxide thickness (EOT) increasing.

In this embodiment, the first nitrogen containing thermal treatment process P1 is an ammonia thermal treatment process, but it is not limited thereto. Preferably, the first nitrogen containing thermal treatment process P1 has a processing temperature of 500° C.~600° C.; the first nitrogen containing thermal treatment process P1 may have a processing pressure of 5~15 torrs, and a processing time of 20~60 seconds, thereby ammonia atoms can be cracked into nitrogen plasma and thus provide nitrogen atoms distributed in the dielectric layer 150, but the nitrogen atoms can just be distributed on a surface S1 of the dielectric layer 150. It is noted that, nitrogen atoms doped by the first nitrogen containing thermal treatment process P1 can have more uniform distribution in the dielectric layer 150 than doped by processes such as a decouple plasma nitridation (DPN) process, which is an non-isotropic process and thus causes a top part of the dielectric layer 150 to have a higher nitrogen concentration than sidewall parts of the dielectric layer 150.

Figure 7:
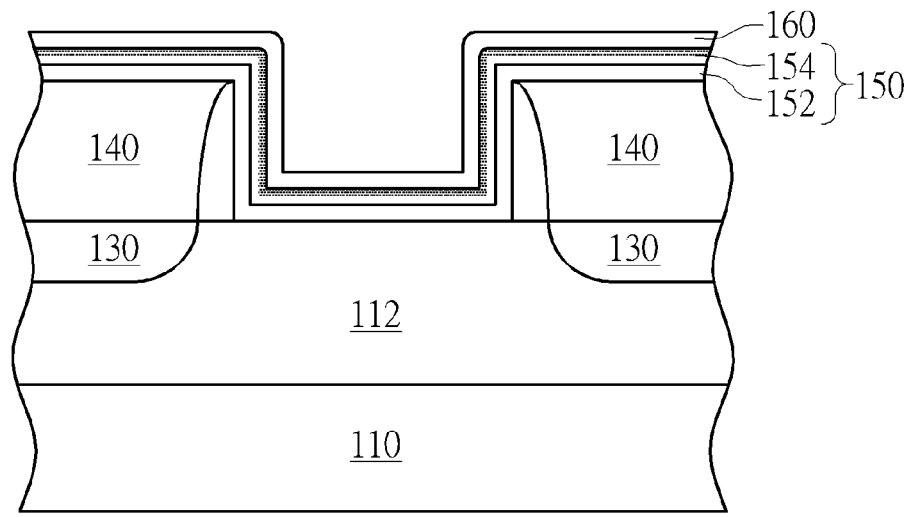

According to the step K3 of FIG. 1—forming a barrier layer on the dielectric layer is performed. As shown in FIG. 7, a barrier layer 160 is formed on the dielectric layer 150. The barrier layer 160 may be a titanium nitride layer, and the barrier layer 160 may have a thickness of 10~20 angstroms, but it is not limited thereto.

Figure 8:
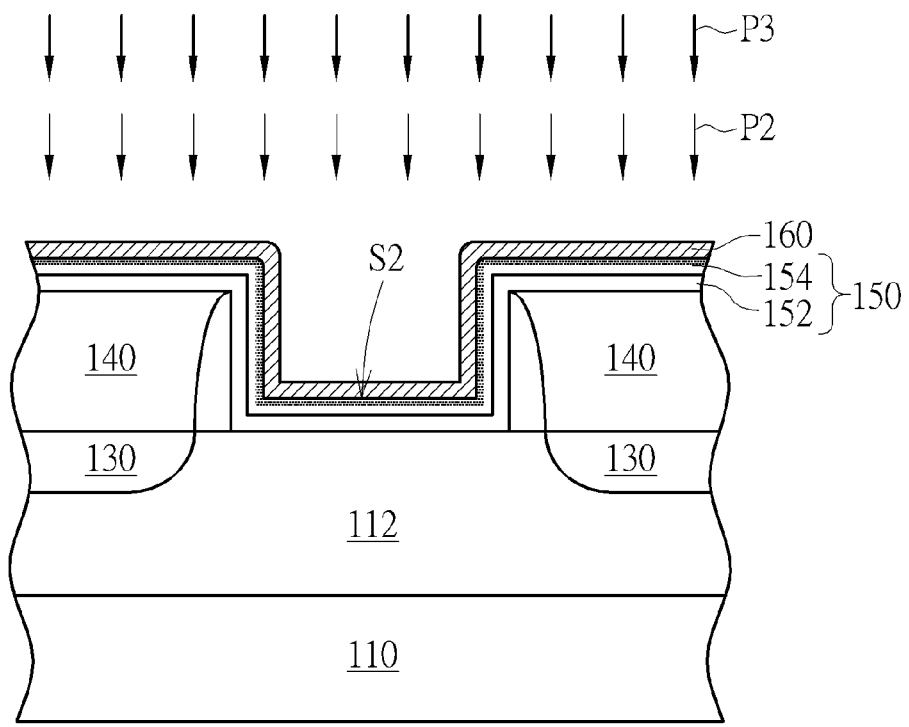

According to the step K4 of FIG. 1—performing a second nitrogen containing thermal treatment process and then an annealing process on the barrier layer is performed. As shown in FIG. 8, a second nitrogen containing thermal treatment process P2 and then an annealing process P3 are performed on the barrier layer 160. Thereby, nitrogen atoms can be doped into the barrier layer 160 to reduce circuit leakage density (Jg) and increase time-dependent dielectric breakdown (TDDB). In this embodiment, the second nitrogen containing thermal treatment process P2 and the annealing process P3 are performed in-situ on the barrier layer 160, but it is not limited thereto. Preferably, the second nitrogen containing thermal treatment process P2 and the annealing process P3 are performed in-situ in the same rapid thermal anneal processing chamber on the barrier layer 160 by directly heating the processing temperature from the processing temperature of the second nitrogen containing thermal treatment process P2 to the processing temperature of the annealing process P3. Hence, the total processing time of the second nitrogen containing thermal treatment process P2 and the annealing process P3 are can be reduced, and the performance of a formed transistor can be improved such as the equivalent oxide thickness (EOT) of the formed transistor can be reduced, and the reliability of the formed transistor can be improved.

It is noted that, the second nitrogen containing thermal treatment process P2 and the annealing process P3 are also preferably applied to provide nitrogen atoms into the dielectric layer 150. Therefore, the first nitrogen containing thermal treatment process P1 has a processing temperature lower than the processing temperature of the second nitrogen containing thermal treatment process P2 because the nitrogen atoms doped into the dielectric layer 150 provided by the second nitrogen containing thermal treatment process P2 is harder than the nitrogen atoms provided by the first nitrogen containing thermal treatment process P1.

Moreover, the second nitrogen containing thermal treatment process P2 and the annealing process P3 are still preferably applied to provide nitrogen atoms into the dielectric layer having a high dielectric constant 154 without diffusing into the buffer layer 152, especially for providing nitrogen atoms into an interface S2 of the dielectric layer having a high dielectric constant 154 and the barrier layer 160. Thus, the second nitrogen containing thermal treatment process P2 may be an ammonia thermal treatment process, and the processing temperature of the ammonia thermal treatment process is preferably at a range of 650° C.~700° C.; the processing time of the ammonia thermal treatment process may be 20~60 seconds while the processing pressure of the ammonia thermal treatment process may be 3~10 torrs, but it is not limited thereto. Besides, the annealing process P3 may be a nitrogen containing gas annealing process by introducing ammonia or nitrogen gas, and the processing temperature of the nitrogen containing gas annealing process is preferably 900° C.~1000° C.; the nitrogen containing gas annealing process may be a spike annealing process having a processing time of 1.5~2 seconds and a processing pressure of 3~10 torrs, but it is not limited thereto.

Figure 9:
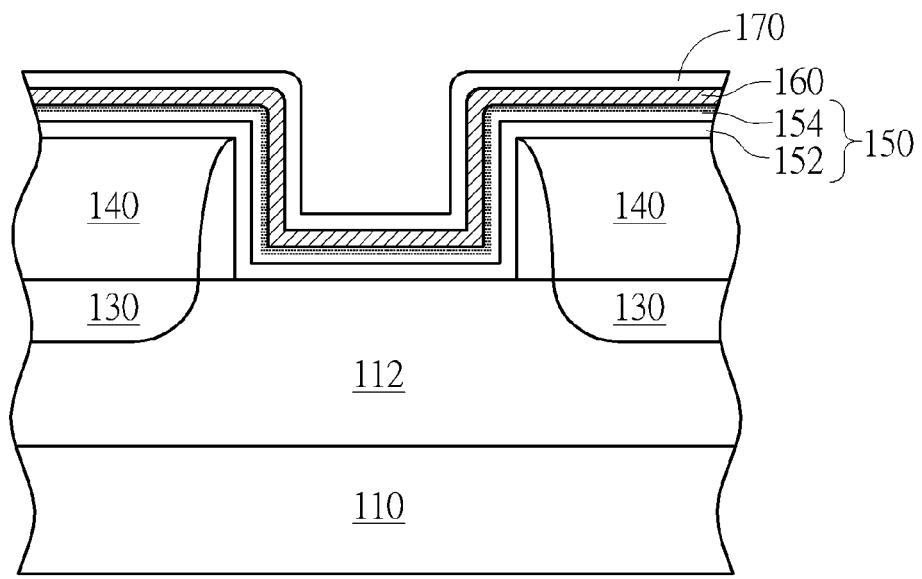

As shown in FIG. 9, a work function layer 170 may cover the barrier layer 160. The work function layer 170 may a P-type work function layer such as titanium nitride (TiN), tantalum nitride (TaN) or tantalum carbide (TaC); or, a N-type work function layer such as titanium aluminide (TiAl), zirconium aluminide (ZrAl), tungsten aluminide (WAl), tantalum aluminide (TaAl), hafniumaluminide (HfAl), titanium aluminum carbide (TiAlC), titanium aluminum nitride (TiAlN), titanium silicon nitride (TiSiN) or tungsten nitride (WN), depending upon electrical demands of a formed transistor. A barrier layer (not shown) or/and a wetting layer (not shown) may cover the work function layer 170. The barrier layer may be composed of titanium nitride (TiN), tantalum nitride (TaN) or others, and the wetting layer may be composed of titanium (Ti), titanium nitride (TiN) or others.

Figure 10:
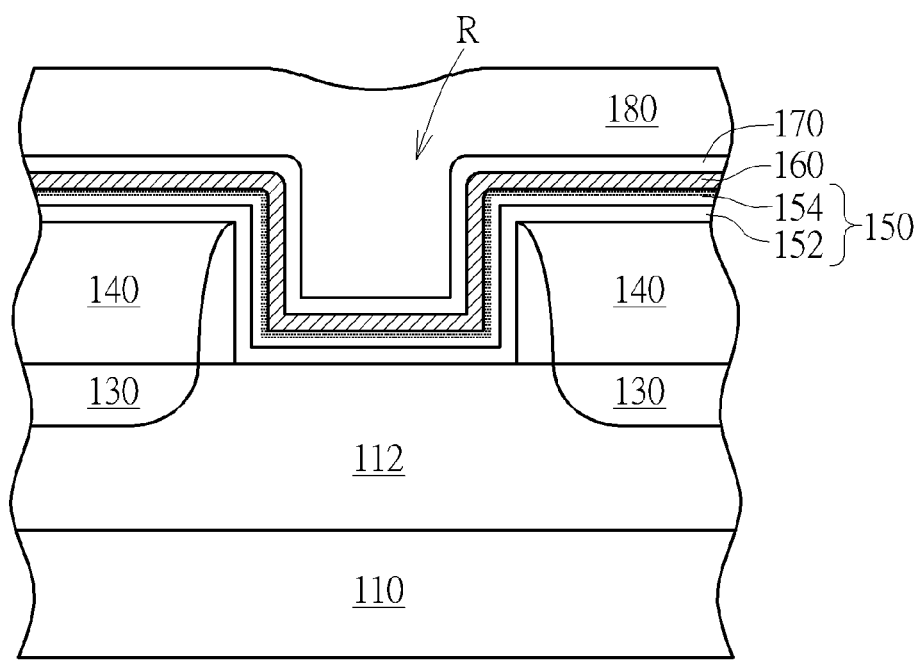

As shown in FIG. 10, a main conductive layer 180 fills the recess R. The main conductive layer 180 may be composed of low resistivity materials such as aluminum, tungsten, titanium aluminum (TiAl) alloy, cobalt tungsten phosphide (CoWP) or others. And then, the main conductive layer 180 and the below layers may be planarized until the dielectric layer 140 is exposed. Thereafter, semiconductor processes such as interconnection processes may be performed sequentially.

To summarize, the present invention provides a semiconductor process, which performs a first nitrogen containing thermal treatment process on a dielectric layer, may include a buffer layer and a dielectric layer having a high dielectric constant from bottom to top to dope ultra-light nitrogen atoms into the dielectric layer; forms a barrier layer on the dielectric layer; and then, performs a second nitrogen containing thermal treatment process and then an annealing process on the barrier layer to dope nitrogen atoms into the barrier layer to improve performances of a formed transistor such as circuit leakage density (Jg) or time-dependent dielectric breakdown (TDDB) of the formed transistor.

Moreover, the second nitrogen containing thermal treatment process and then an annealing process are preferably performed in-situ, and still preferably performed by directly heating the processing temperature from the processing temperature of the second nitrogen containing thermal treatment process to the processing temperature of the annealing process. Thereby, the total processing time of the second nitrogen containing thermal treatment process and the annealing process are can be reduced, and the performance such as the equivalent oxide thickness (EOT) or the reliability of a formed transistor can be improved.

Furthermore, the second nitrogen containing thermal treatment process preferably has a processing temperature higher than the processing temperature of the first nitrogen containing thermal treatment process for doping nitrogen atoms into the dielectric layer as well. The first nitrogen containing thermal treatment process and the second nitrogen containing thermal treatment process may both ammonia thermal treatment processes, but the processing temperature of the first nitrogen containing thermal treatment process is preferably 500° C.~600° C. while the processing temperature of the second nitrogen containing thermal treatment process is preferably 650° C.~700° C. Moreover, the annealing process may be accompanied with a nitrogen containing gas annealing process with a processing temperature of 900° C.~1000° C. to provide a spike annealing right after the second nitrogen containing thermal treatment process.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor process, comprising:
   forming a dielectric layer on a substrate;
   forming a barrier layer on the dielectric layer; and
   sequentially and uninterruptedly performing an ammonia thermal treatment process with a processing temperature of 650° C.~700° C. and a nitrogen containing gas annealing process with a processing temperature of 900° C.~1000° C. on the barrier layer.

2. The semiconductor process according to claim 1, wherein the dielectric layer comprises a buffer layer and a dielectric layer having a high dielectric constant from bottom to top.

3. The semiconductor process according to claim 1, wherein the barrier layer comprises a titanium nitride layer.

4. The semiconductor process according to claim 1, wherein the ammonia thermal treatment process with a processing temperature of 650° C.~700° C. and the nitrogen containing gas annealing process with a processing temperature of 900° C.~1000° C. are performed in-situ.

5. The semiconductor process according to claim 4, wherein the ammonia thermal treatment process with a processing temperature of 650° C.~700° C. and the nitrogen containing gas annealing process with a processing temperature of 900° C.~1000° C. are performed in-situ by directly heating the temperature from the processing temperature of the ammonia thermal treatment process to the processing temperature of the nitrogen containing gas annealing process.

6. The semiconductor process according to claim 1, further comprising:
   performing a first nitrogen containing thermal treatment process on the dielectric layer before the barrier layer is formed.

7. The semiconductor process according to claim 6, wherein the first nitrogen containing thermal treatment process comprises an ammonia thermal treatment process.

8. The semiconductor process according to claim 7, wherein the first nitrogen containing thermal treatment process has a processing temperature lower than the processing temperature of the ammonia thermal treatment process with a processing temperature of 650° C.~700° C.

9. The semiconductor process according to claim 8, wherein the first nitrogen containing thermal treatment process has a processing temperature of 500° C.~600° C.

10. A semiconductor process, comprising:
    forming a dielectric layer on a substrate;
    performing a first nitrogen containing thermal treatment process on the dielectric layer;
    forming a barrier layer on the dielectric layer; and
    performing a second nitrogen containing thermal treatment process and then an annealing process in-situ on the barrier layer.

11. The semiconductor process according to claim 10, wherein the dielectric layer comprises a buffer layer and a dielectric layer having a high dielectric constant from bottom to top.

12. The semiconductor process according to claim 10, wherein the barrier layer comprises a titanium nitride layer.

13. The semiconductor process according to claim 10, wherein the second nitrogen containing thermal treatment process comprises an ammonia thermal treatment process.

14. The semiconductor process according to claim 13, wherein the ammonia thermal treatment process has a processing temperature of 650° C.~700° C.

15. The semiconductor process according to claim 10, wherein the annealing process comprises a nitrogen containing gas annealing process.

16. The semiconductor process according to claim 15, wherein the nitrogen containing gas annealing process has a processing temperature of 900° C.~1000° C.

17. The semiconductor process according to claim 10, wherein the second nitrogen containing thermal treatment process and the annealing process are performed by directly heating the temperature from the processing temperature of the second nitrogen containing thermal treatment process to the processing temperature of the annealing process.

18. The semiconductor process according to claim 10, wherein the first nitrogen containing thermal treatment process has a processing temperature lower than the processing temperature of the second nitrogen containing thermal treatment process.

19. The semiconductor process according to claim 10, wherein the first nitrogen containing thermal treatment process comprises an ammonia thermal treatment process.

20. The semiconductor process according to claim 19, wherein the first nitrogen containing thermal treatment process has a processing temperature of 500° C.~600° C.

* * * * *